(12) United States Patent
Yu

(10) Patent No.: US 12,538,628 B2
(45) Date of Patent: Jan. 27, 2026

(54) FLEXIBLE DISPLAY DEVICE

(71) Applicant: Au Optronics Corporation, Hsinchu (TW)

(72) Inventor: Fang-Cheng Yu, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 745 days.

(21) Appl. No.: 17/842,741

(22) Filed: Jun. 16, 2022

(65) Prior Publication Data

US 2023/0054489 A1 Feb. 23, 2023

(30) Foreign Application Priority Data

Aug. 19, 2021 (TW) ................. 110130584

(51) Int. Cl.
*H10H 29/14* (2025.01)
*H10H 20/819* (2025.01)
*H10H 20/85* (2025.01)

(52) U.S. Cl.
CPC ........ *H10H 29/142* (2025.01); *H10H 20/819* (2025.01); *H10H 20/85* (2025.01)

(58) Field of Classification Search
CPC .. H10H 29/142; H01L 25/167; H01L 25/0753
See application file for complete search history.

(56) References Cited

U.S. PATENT DOCUMENTS

| | | | |
|---|---|---|---|
| 10,573,628 B2* | 2/2020 | Kim | H10D 86/441 |
| 11,038,109 B2 | 6/2021 | Cui et al. | |
| 2010/0259920 A1* | 10/2010 | Lin | F21S 4/28 |
| | | | 362/249.02 |
| 2017/0250318 A1* | 8/2017 | Cha | H10H 20/8514 |
| 2018/0047780 A1* | 2/2018 | Yeon | H10H 20/84 |
| 2019/0157515 A1* | 5/2019 | Kim | H10H 20/825 |
| 2019/0393389 A1* | 12/2019 | Chen | H10H 20/8514 |
| 2020/0066989 A1 | 2/2020 | Cui et al. | |
| 2020/0111978 A1* | 4/2020 | Kim | H10D 86/443 |
| 2020/0152827 A1* | 5/2020 | Chen | H10H 20/857 |
| 2021/0043616 A1* | 2/2021 | Jung | H10H 20/01 |
| 2021/0110748 A1* | 4/2021 | Kim | H10H 20/831 |
| 2021/0134877 A1* | 5/2021 | Kim | H10H 29/142 |
| 2022/0044976 A1* | 2/2022 | Ko | H10H 20/821 |
| 2022/0045244 A1* | 2/2022 | Yoo | H10H 20/831 |
| 2022/0058994 A1* | 2/2022 | Tseng | G09F 9/3026 |
| 2022/0059510 A1* | 2/2022 | Su | H10H 20/857 |
| 2022/0077228 A1* | 3/2022 | Do | H10H 20/831 |

FOREIGN PATENT DOCUMENTS

| | | | |
|---|---|---|---|
| CN | 102610603 A | * | 7/2012 |
| CN | 108257516 | | 7/2018 |
| CN | 108281474 | | 7/2018 |
| CN | 209691790 | | 11/2019 |
| CN | 111373555 | | 7/2020 |
| CN | 111900242 | | 11/2020 |

* cited by examiner

*Primary Examiner* — Ratisha Mehta
*Assistant Examiner* — Adam Joseph Mott
(74) *Attorney, Agent, or Firm* — JCIPRNET

(57) ABSTRACT

A display device, including a circuit substrate and multiple light emitting units, is provided. The light emitting units are located on the circuit substrate and are electrically connected to the circuit substrate. Each light emitting unit includes a main isolation structure and multiple light emitting elements, and the main isolation structure surrounds the light emitting elements.

16 Claims, 10 Drawing Sheets

FLEXIBLE DISPLAY DEVICE

CROSS-REFERENCE TO RELATED APPLICATION

This application claims the priority benefit of Taiwan application serial no. 110130584, filed on Aug. 19, 2021. The entirety of the above-mentioned patent application is hereby incorporated by reference herein and made a part of this specification.

BACKGROUND

Technical Field

The disclosure relates to a display device, and more particularly to a display device with flexibility.

Description of Related Art

The micro-light emitting diode (LED) display device has advantages such as power saving, high efficiency, high brightness, and fast response time. Due to the extremely small pitch (<100 μm) and point light source characteristics of the micro-LED, the current practice is to provide an isolation structure (bank) between the micro-LEDs to solve the issues of crosstalk between sub-pixels and a view cone. However, the mesh-shaped rigid isolation structure is not flexible, which hinders the application of the micro-LED display device in a flexible display.

SUMMARY

The disclosure provides a display device with flexibility.

An embodiment of the disclosure provides a display device, which includes a circuit substrate and multiple light emitting units. The light emitting units are located on the circuit substrate and are electrically connected to the circuit substrate. Each light emitting unit includes a main isolation structure and multiple light emitting elements, and the main isolation structure surrounds the light emitting elements.

In an embodiment of the disclosure, the circuit substrate includes a flexible substrate and a driving circuit layer. The driving circuit layer is located between the flexible substrate and the light emitting unit, and the light emitting unit is electrically connected to the driving circuit layer.

In an embodiment of the disclosure, the main isolation structures of the light emitting units are separated from each other.

In an embodiment of the disclosure, each light emitting unit further has multiple spare regions, and a number of the spare regions of each light emitting unit is greater than or equal to a number of the light emitting elements.

In an embodiment of the disclosure, the spare regions are all located in the main isolation structure.

In an embodiment of the disclosure, a shortest pitch between the main isolation structures is greater than a shortest distance between the main isolation structure and the light emitting element.

In an embodiment of the disclosure, each light emitting unit further includes multiple secondary isolation structures. The secondary isolation structures separate the main isolation structure into multiple compartments.

In an embodiment of the disclosure, a first compartment among the compartments accommodates one light emitting element and a first spare region among the spare regions.

In an embodiment of the disclosure, a second spare region among the spare regions is located outside the main isolation structure.

In an embodiment of the disclosure, the display device further includes a color conversion layer, which is located in the first compartment and covers the light emitting element.

In an embodiment of the disclosure, a second compartment among the compartments accommodates one light emitting element and does not accommodate the spare region.

In an embodiment of the disclosure, the display device further includes a first cover layer, which is located between the main isolation structures.

In an embodiment of the disclosure, the display device further includes a second cover layer, which is located in the main isolation structure and covers the light emitting element.

In an embodiment of the disclosure, an elongation percentage of the first cover layer is greater than an elongation percentage of the second cover layer.

In an embodiment of the disclosure, the light emitting elements of each light emitting unit have different light colors, and light colors of the light emitting elements of the adjacent light emitting units are symmetrically configured.

In an embodiment of the disclosure, the display device further includes a light shielding layer, which is located on the light emitting units. The light shielding layer has multiple first openings, and an orthographic projection of the first opening on the circuit substrate overlaps with an orthographic projection of the light emitting element on the circuit substrate.

In an embodiment of the disclosure, the light shielding layer further has multiple second openings, and an orthographic projection of the second opening on the circuit substrate is located outside an orthographic projection of the light emitting unit on the circuit substrate.

In order for the features and advantages of the disclosure to be more comprehensible, the following specific embodiments are described in detail in conjunction with the drawings.

DETAILED DESCRIPTION OF DISCLOSED EMBODIMENTS

Figure 1A:
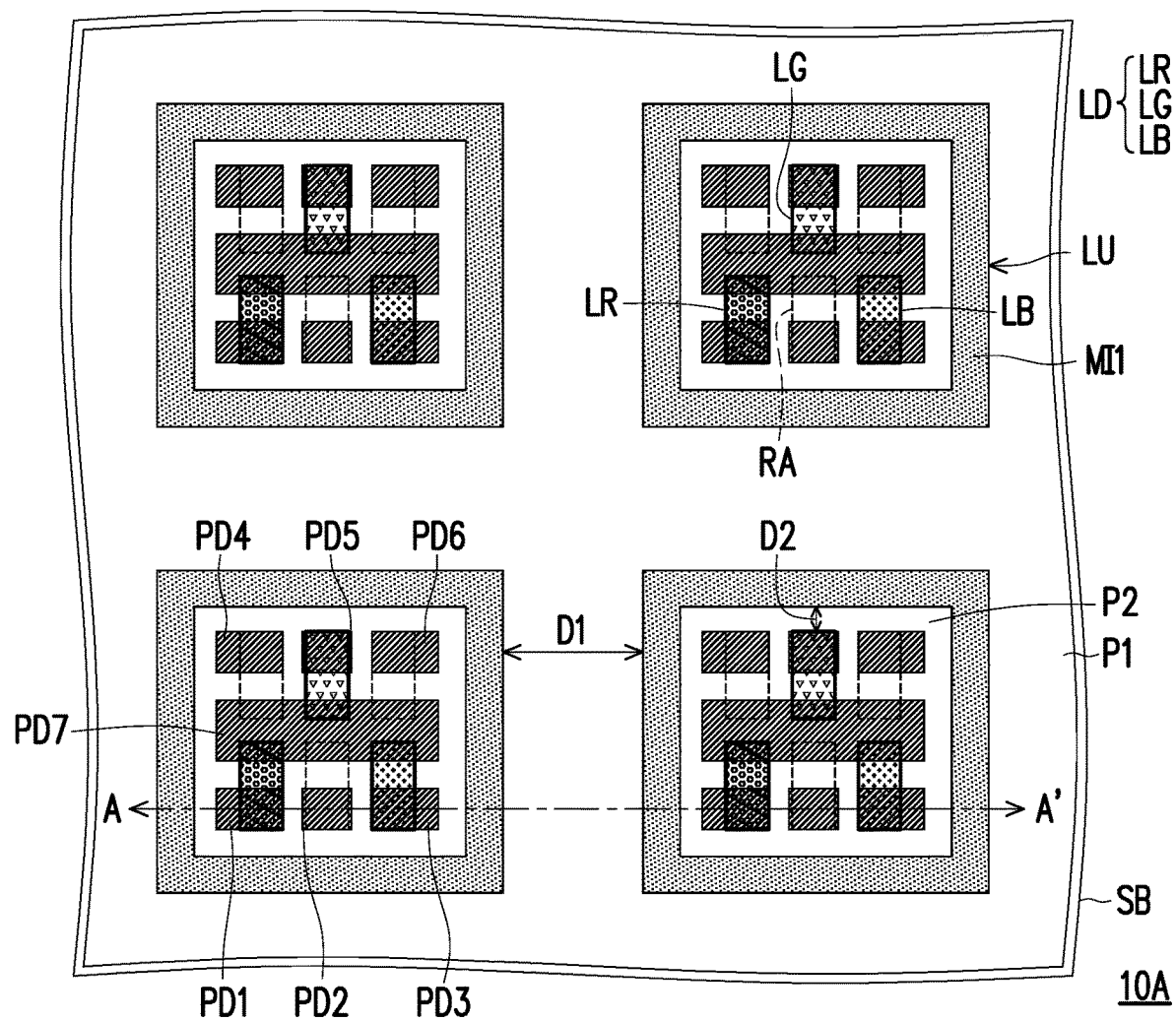
FIG. 1A is a schematic partial top view of a display device 10A according to an embodiment of the disclosure.
Figure 1B:
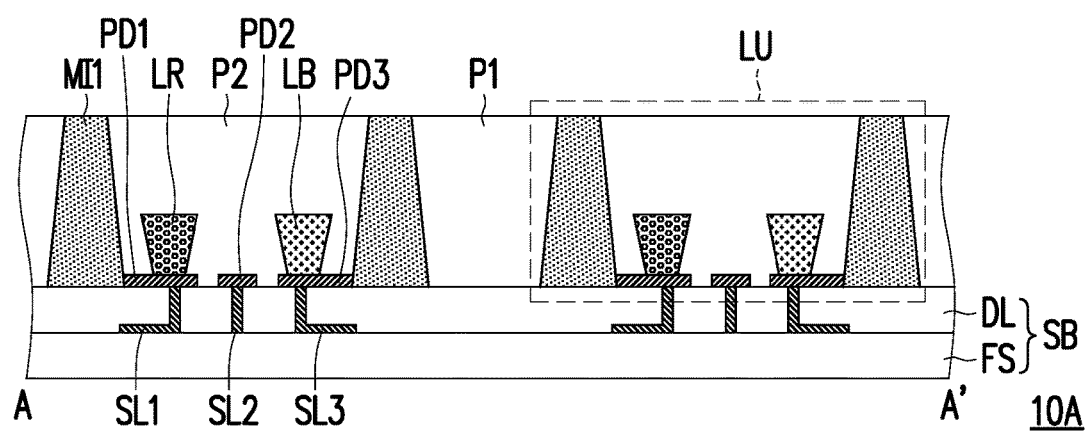
FIG. 1B is a schematic cross-sectional view taken along a section line A-A' of FIG. 1A.

FIG. 1A is a schematic partial top view of a display device 10A according to an embodiment of the disclosure. FIG. 1B is a schematic cross-sectional view taken along a section line A-A' of FIG. 1A. Please refer to FIG. 1A and FIG. 1B. The display device 10A includes a circuit substrate SB; and multiple light emitting units LU, located on the circuit substrate SB and electrically connected to the circuit substrate SB, wherein each light emitting unit LU includes a main isolation structure MI1 and multiple light emitting elements LD, and the main isolation structure MI1 surrounds the light emitting elements LD.

In the display device 10A of an embodiment of the disclosure, the light emitting elements LD are surrounded by the main isolation structure MI1 of the light emitting unit LU, so that the light emitting unit LU has a complete island structure, and the island structures of the light emitting units LU are mutually independent. In this way, when the display device 10A is bent, only the circuit substrate SB between the light emitting units LU is bent, and each light emitting unit LU may still maintain a complete structure, thereby improving the flexibility of the display device 10A.

Hereinafter, with reference to FIG. 1A and FIG. 1B, the implementations of various elements and film layers of the display device 10A will be described, but the disclosure is not limited thereto.

In the embodiment, the circuit substrate SB of the display device 10A may include a flexible substrate FS and a driving circuit layer DL, wherein the driving circuit layer DL may be located between the flexible substrate FS and the light emitting unit LU, and the light emitting unit LU may be electrically connected to the driving circuit layer DL.

In detail, the flexible substrate FS may be a transparent substrate or an opaque substrate, and the material thereof may be polyimide (PI), polycarbonate (PC), polyester (PET), cyclic olefin copolymer (COC), metallocene-based cyclic olefin copolymer (mCOC), or other suitable materials, and the disclosure is not limited thereto.

The driving circuit layer DL may include elements or circuits required by the display device 10A, such as a driving element, a switching element, a storage capacitor, a power line, a driving signal line, a timing signal line, a current compensation line, and a detection signal line. For example, in the embodiment, the driving circuit layer DL may include signal lines SL1, SL2, and SL3 and pads PD1, PD2, PD3, PD4, PD5, PD6, and PD7, wherein the pads PD1 and PD4 may be electrically connected to the signal line SL1, the pads PD2 and PD5 may be electrically connected to the signal line SL2, the pads PD3 and PD6 may be electrically connected to the signal line SL3, and the pad PD7 may be electrically connected to other signal lines, such as the power line.

In the embodiment, the light emitting elements LD of the light emitting unit LU may include three light emitting elements LR, LG, and LB, but not limited thereto. The light emitting element LR is, for example, a red light emitting diode, the light emitting element LG is, for example, a green light emitting diode, and the light emitting element LB is, for example, a blue light emitting diode. In this way, the light emitting elements LR, LG, and LB may respectively constitute a sub-pixel of the display device 10A, and the light emitting unit LU may constitute a pixel of the display device 10A.

The light emitting elements LR, LG, and LB are, for example, manufactured on a growth substrate, then transferred to the circuit substrate SB through a mass transfer process, and respectively electrically connected to the signal lines SL1, SL2, and SL3. For example, the signal line SL1 may be electrically connected to the pad PD1 or the pad PD4, the signal line SL2 may be electrically connected to the pad PD2 or the pad PD5, and the signal line SL3 may be electrically connected to the pad PD3 or the pad PD6. An anode of the light emitting element LR may be electrically connected to the pad PD1 or the pad PD4, an anode of light emitting element LG may be electrically connected to the pad PD2 or the pad PD5, an anode of the light emitting element LB may be electrically connected to the pad PD3 or the pad PD6, and cathodes of the light emitting elements LR, LG, and LB may all be electrically connected to the pad PD7. In the embodiment, the anode of the light emitting element LR is electrically connected to the pad PD1, the anode of the light emitting element LG is electrically connected to the pad PD5, the anode of the light emitting element LB is electrically connected to the pad PD3, and the cathodes of the light emitting elements LR, LG, and LB are all electrically connected to the pad PD7. Other conductive materials, such as solder or conductive adhesive, may also be included between the light emitting elements LR, LG, and LB and the pads PD1, PD2, PD3, PD4, PD5, PD6, and PD7.

The light emitting unit LU may also have multiple spare regions RA, and the number of spare regions RA of each light emitting unit LU may be greater than or equal to the number of light emitting elements LD. For example, in the embodiment, the light emitting unit LU includes the three light emitting elements LR, LG, and LB, and the light emitting unit LU has three spare regions RA. When the light emitting elements LR, LG, and LB are dislocated, tilted, or omitted during a transfer process, the light emitting element LR, the light emitting element LG, or the light emitting element LB may be disposed in the spare region RA again by a repair process to repair sub-pixels that cannot operate normally.

In the embodiment, the main isolation structure MI1 of the light emitting unit LU surrounds all the light emitting elements LD and the spare regions RA thereof, and the main isolation structures MI1 of the light emitting units LU are separated from each other, so that each light emitting unit LU has a complete and independent island structure. When the display device 10A is bent, the bending mainly occurs in the circuit substrate SB between the light emitting units LU, and the light emitting unit LU can still maintain a complete structure. In addition, relevant circuits of the light emitting elements LD may be concentrated under the island structure of the light emitting unit LU to avoid stress damage generated during the bending. In addition, the light emitting elements LD and the spare regions RA of each light emitting unit LU are all located in the main isolation structure MI1, which can also ensure that the optical efficiencies of the light emitting elements LD are relatively consistent after the repair process.

In the embodiment, the main isolation structure MI1 has the shape of a square ring. However, the shape of the main isolation structure MI1 is not particularly limited and may be determined according to actual configuration requirements of the light emitting unit LU. In some embodiments, there may be a shortest pitch D1 between the main isolation structures MI1, there may be a shortest distance D2 between the main isolation structure MI1 and the light emitting element LD, and the pitch D1 may be greater than the distance D2 to allow the display device 10A to provide sufficient flexibility. In addition, the material of the main isolation structure MI1 may include an inorganic material, an organic material, or a combination or stack of different materials. For example, the inorganic material may include oxide or nitride, such as silicon oxide (SiOx) or silicon nitride (SiNx), but not limited thereto. The organic material may include a photoresist material, a curable resin material, or other suitable materials.

In some embodiments, the display device 10A may further include a cover layer P1, and the cover layer P1 may be located between the main isolation structures MI1. The material of the cover layer P1 may include a material with a high elongation, such as glue, photoresist, or ink. In some embodiments, the cover layer P1 may have a tensile strength ranging from 70 MPa to 100 MPa, an elongation ranging from 20% to 100%, or a Young's modulus ranging from 2 GPa to 3 GPa.

In some embodiments, the display device 10A may further include a cover layer P2, and the cover layer P2 may be located in the main isolation structure MI1 and cover the light emitting elements LD and the circuit substrate SB to adjust the light emitting efficiency of the light emitting element LD. The material of the cover layer P2 may include an optical material, such as photoresist, and an elongation percentage of the cover layer P1 is preferably greater than an elongation percentage of the cover layer P2. In some embodiments, the cover layer P2 may also have a tensile strength ranging from 30 MPa to 60 MPa, an elongation of less than 10%, or a Young's modulus ranging from 2 GPa and 3 GPa.

Hereinafter, other embodiments of the disclosure will be described with reference to FIG. 2 to FIG. 11B, and the reference numerals and the relevant contents of the embodiment of FIG. 1A and FIG. 1B will continue to be used, wherein the same reference numerals are adopted to represent the same or similar elements, and the description of the same technical content is omitted. For the description of the omitted part, reference may be made to the embodiment of FIG. 1A and FIG. 1B, which will not be repeated in the following description.

Figure 2:
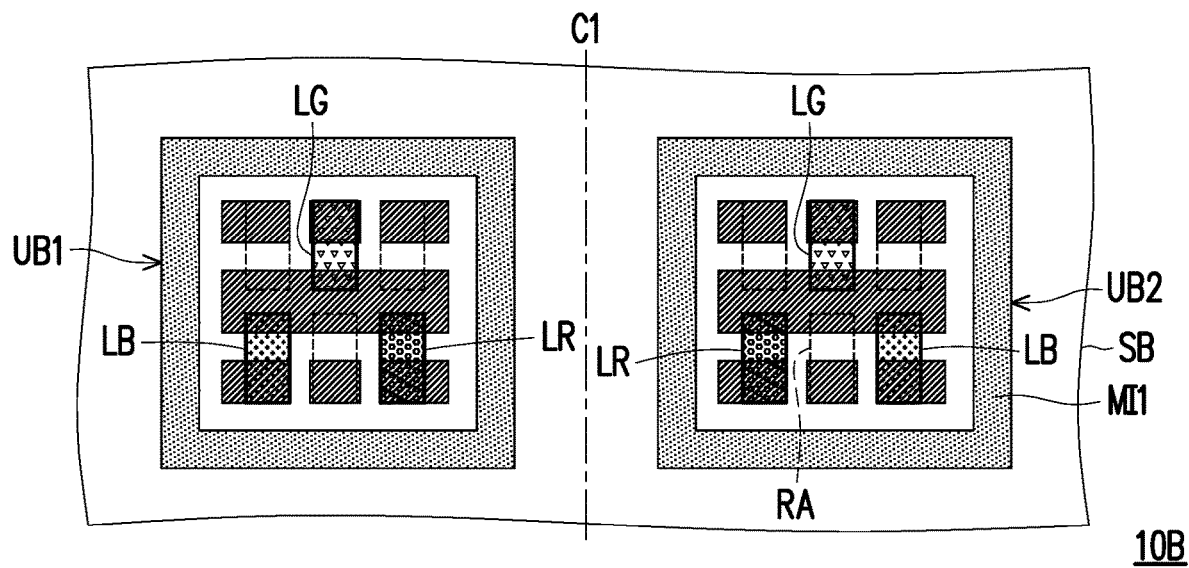
FIG. 2 is a schematic partial top view of a display device 10B according to an embodiment of the disclosure.

FIG. 2 is a schematic partial top view of a display device 10B according to an embodiment of the disclosure. Compared with the display device 10A shown in FIG. 1A to FIG. 1B, the display device 10B shown in FIG. 2 is different in that the display device 10B includes light emitting units UB1 and UB2, wherein the configuration of the light emitting elements LR, LG, and LB of the light emitting unit UB1 is different from the light emitting unit LU, and the configuration of the light emitting elements LR, LG, and LB of the light emitting unit UB2 is the same as the light emitting unit LU.

In the embodiment, the configurations of the light emitting elements LR, LG, and LB of the adjacent light emitting units UB1 and UB2 are different, and the light emitting elements LR, LG, and LB of the light emitting unit UB1 and the light emitting elements LR, LG, and LB of the light emitting unit UB2 are configured in mirror symmetry with a center line C1 between the light emitting unit UB1 and the light emitting unit UB2. In this way, the main isolation structure MI1 can adjust the light emitting field type and the viewing angle of the light emitting elements LR, LG, and LB. At the same time, the symmetrical configuration can also effectively compensate the monochromatic light field type difference caused by the annular main isolation structure MI1 to the light emitting elements LR, LG, and LB individually.

Figure 3:
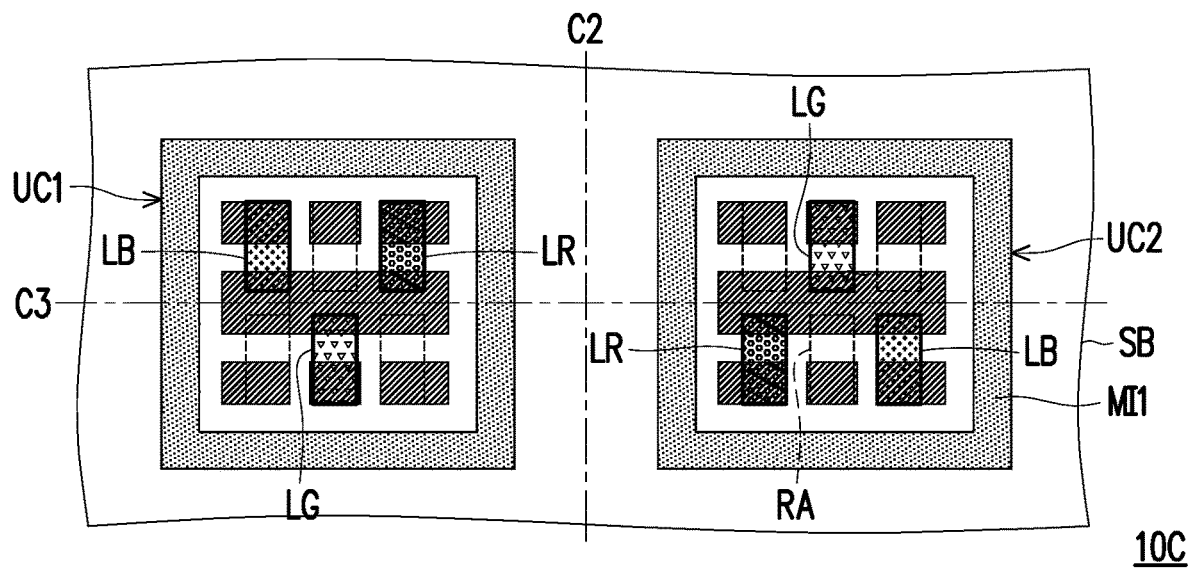
FIG. 3 is a schematic partial top view of a display device 10C according to an embodiment of the disclosure.

FIG. 3 is a schematic partial top view of a display device 10C according to an embodiment of the disclosure. Compared with the display device 10A shown in FIG. 1A and FIG. 1B, the display device 10C shown in FIG. 3 is different in that the display device 10C includes light emitting units UC1 and UC2, wherein the configuration of the light emitting elements LR, LG, and LB of the light emitting unit UC1 is different from the light emitting unit LU, and the configuration of the light emitting elements LR, LG, and LB of the light emitting unit UC2 is the same as the light emitting unit LU.

In the embodiment, the configurations of the light emitting elements LR, LG, and LB of the light emitting unit UC1 and the light emitting unit UC2 are different, and the light emitting elements LR, LG, and LB of the light emitting unit UC1 and the light emitting elements LR, LG, and LB of the light emitting unit UC2 are configured in mirror symmetry with a center line C2 between the light emitting unit UB1 and the light emitting unit UB2 and a center line C3 perpendicular to the center line C2. In this way, the main isolation structure MI1 can adjust the light emitting field type and the viewing angle of the light emitting elements LR, LG, and LB. At the same time, the symmetrical configuration can also effectively compensate the monochromatic light field type difference caused by the annular main isolation structure MI1 to the light emitting elements LR, LG, and LB individually.

Figure 4:
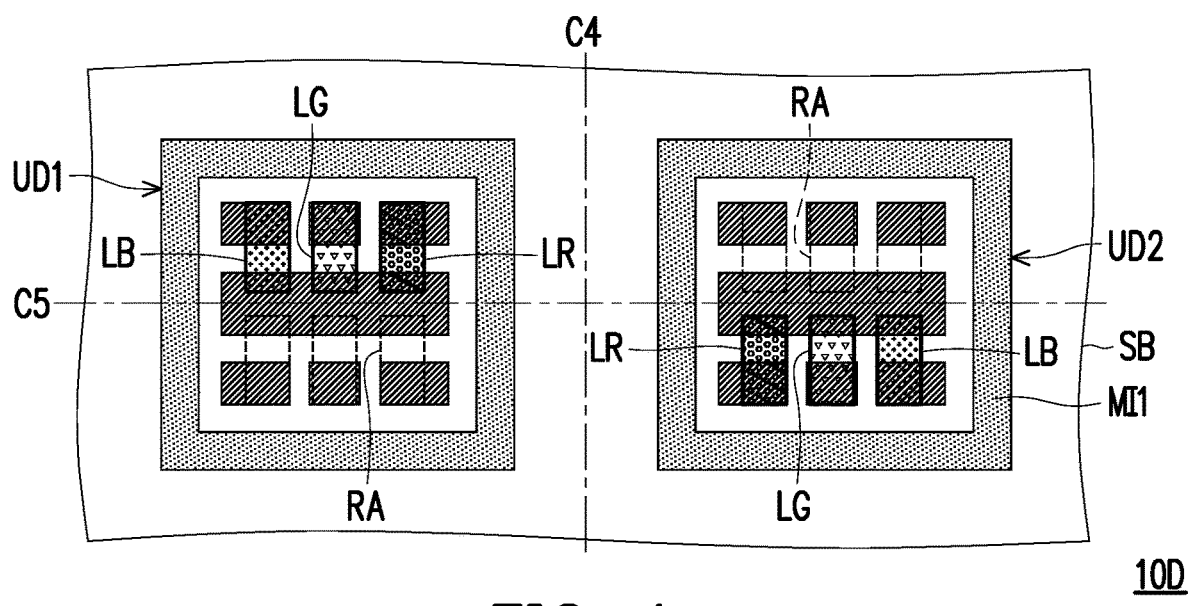
FIG. 4 is a schematic partial top view of a display device 10D according to an embodiment of the disclosure.

FIG. 4 is a schematic partial top view of a display device 10D according to an embodiment of the disclosure. Compared with the display device 10A shown in FIG. 1A and FIG. 1B, the display device 10D shown in FIG. 4 is different in that the display device 10D includes light emitting units UD1 and UD2, wherein the configurations of the light emitting elements LR, LG and LB of the light emitting units UD1 and UD2 are different from the light emitting unit LU.

In the embodiment, the configurations of the light emitting elements LR, LG, and LB of the light emitting unit UD1 and the light emitting unit UD2 are different, and the light emitting elements LR, LG, and LB of the light emitting unit UD1 and the light emitting elements LR, LG, and LB of the light emitting unit UD2 are configured in mirror symmetry with a center line C4 between the light emitting unit UB1 and the light emitting unit UB2 and a center line C5 perpendicular to the center line C4. In this way, the main isolation structure MI1 can adjust the light emitting field type and the viewing angle of the light emitting elements LR, LG, and LB. At the same time, the symmetrical configuration can also effectively compensate the monochromatic light field type difference caused by the annular main isolation structure MI1 to the light emitting elements LR, LG, and LB individually.

Figure 5A:
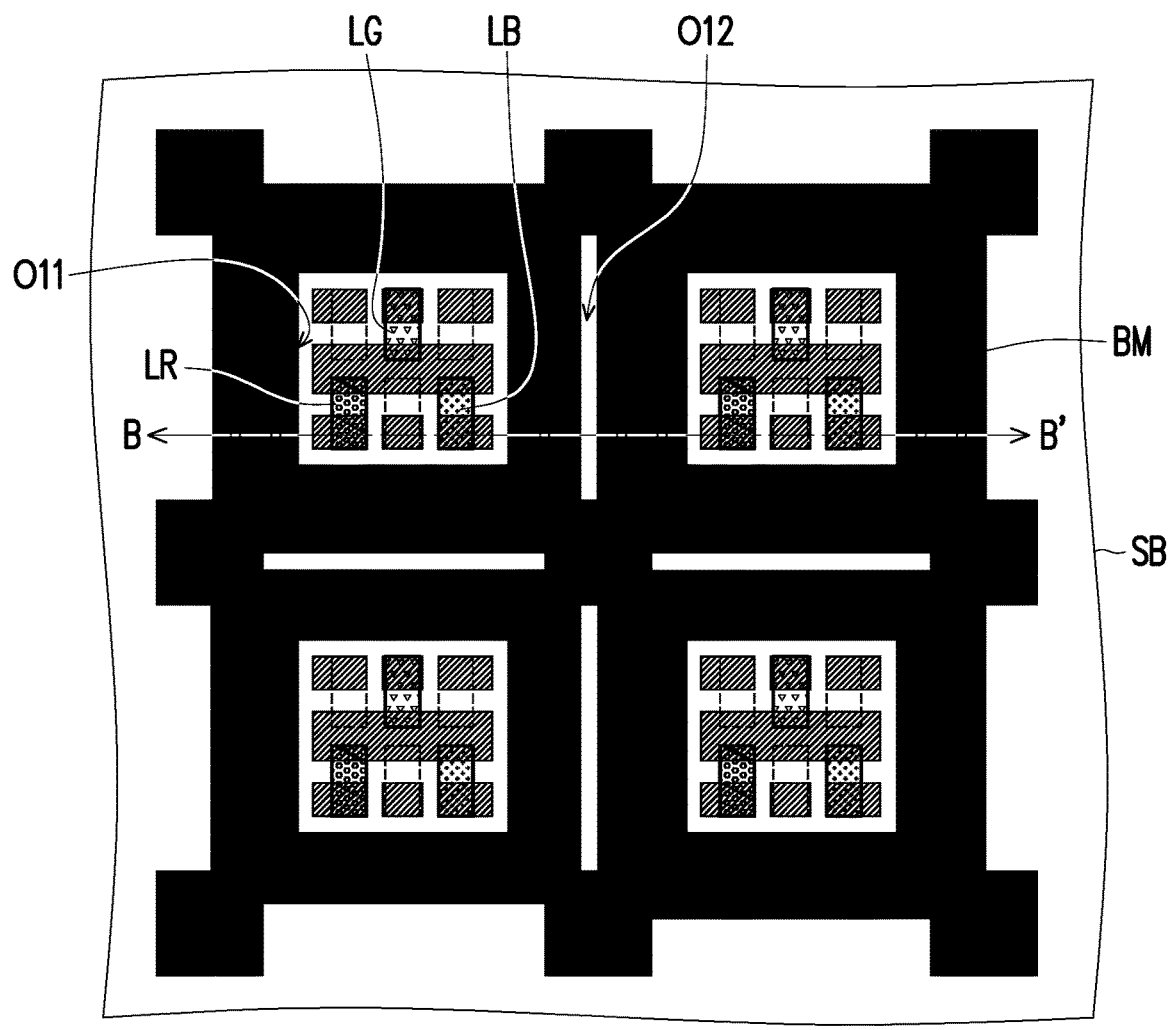
FIG. 5A is a schematic partial top view of a display device 10J according to an embodiment of the disclosure.
Figure 5B:
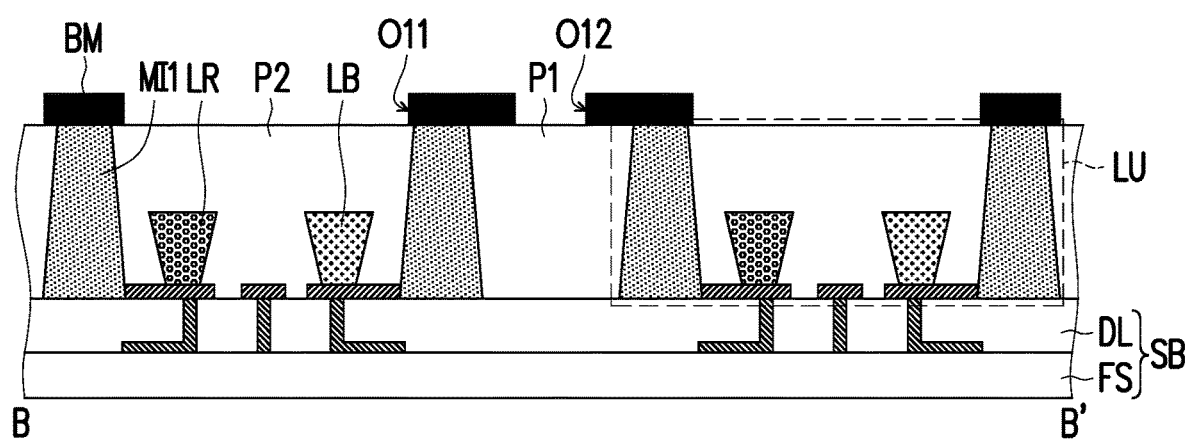
FIG. 5B is a schematic cross-sectional view taken along a section line B-B' of FIG. 5A.

FIG. 5A is a schematic partial top view of a display device 10J according to an embodiment of the disclosure. FIG. 5B is a schematic cross-sectional view taken along a section line B-B' of FIG. 5A. Compared with the display device 10A shown in FIG. 1A and FIG. 1B, the display device 10J shown in FIG. 5A and FIG. 5B is different in that the display device 10J further includes a light shielding layer BM.

In the embodiment, the light shielding layer BM is located on the light emitting unit LU, and the light shielding layer BM may shield the reflection of ambient light by a metal trace and the main isolation structure MI1 to reduce the brightness of a dark state and improve the contrast. In addition, the light shielding layer BM may have multiple openings O11, and an orthographic projection of the opening O11 on the circuit substrate SB may overlap with orthographic projections of the light emitting elements LR, LG, and LB on the circuit substrate SB to not affect the light emission of the light emitting elements LR, LG, and LB, while reducing stress damage when the display device 10J is bent.

In some embodiments, the light shielding layer BM may further have multiple openings O12, and an orthographic projection of the opening O12 on the circuit substrate SB may be located outside an orthographic projection of the light emitting unit LU on the circuit substrate SB. In this way, stress change when the display device 10J is bent can be further reduced.

Figure 6A:
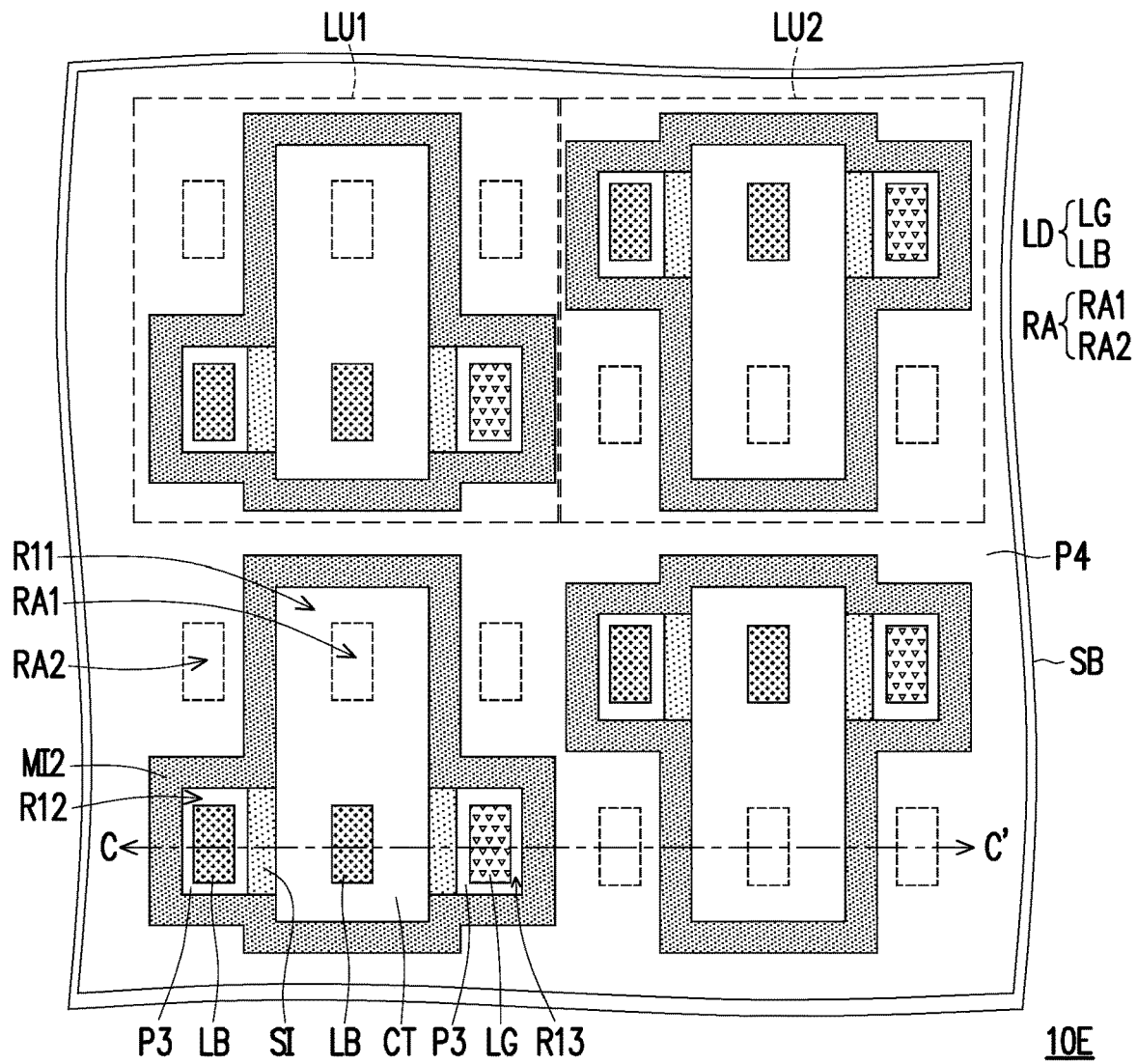
FIG. 6A is a schematic partial top view of a display device 10E according to an embodiment of the disclosure.
Figure 6B:
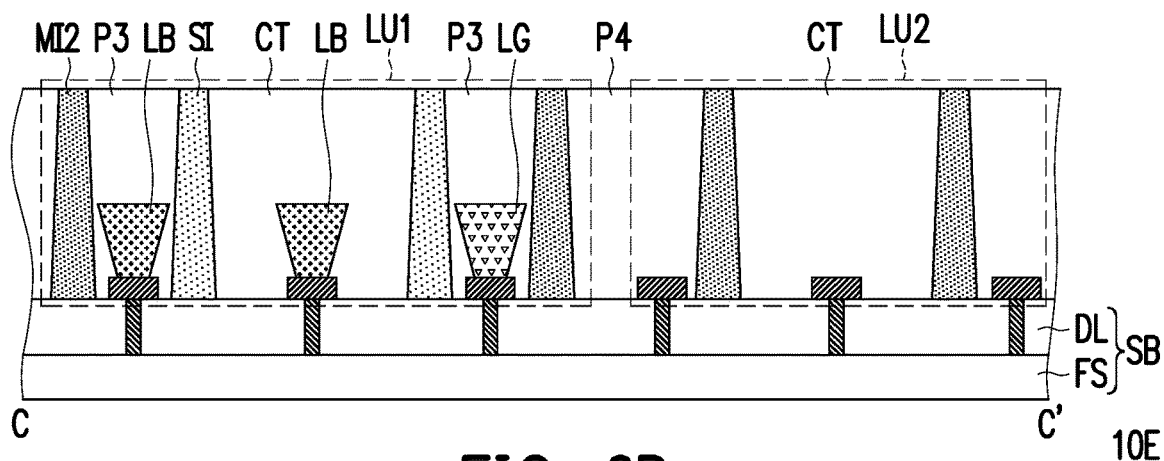
FIG. 6B is a schematic cross-sectional view taken along a section line C-C' of FIG. 6A.

FIG. 6A is a schematic partial top view of a display device 10E according to an embodiment of the disclosure. FIG. 6B is a schematic cross-sectional view taken along a section line C-C' of FIG. 6A. Referring to FIG. 6A and FIG. 6B, the display device 10E includes a circuit substrate SB and multiple light emitting units LU1 and LU2. The circuit substrate SB includes a flexible substrate FS and a driving circuit layer DL. The light emitting units LU1 and LU2 are located on the circuit substrate SB and are electrically connected to the driving circuit layer DL of the circuit substrate SB. Each of the light emitting units LU1 and LU2 includes a main isolation structure MI2, multiple light emitting elements LD, and multiple spare regions RA, and the main isolation structure MI2 surrounds the light emitting elements LD.

Compared with the display device 10A shown in FIG. 1A and FIG. 1B, the display device 10E shown in FIG. 6A and FIG. 6B is different in that the shapes of the main isolation structures MI2 of the light emitting units LU1 and LU2 of the display device 10E are different from the shape of the main isolation structure MI1 of the display device 10A, the light emitting units LU1 and LU2 further respectively includes two secondary isolation structures SI, and a part of the spare regions RA are located outside the main isolation structure MI2.

For example, in the embodiment, the secondary isolation structure SI may separate the main isolation structure MI2 into compartments R11, R12, and R13, wherein the compartments R12 and R13 are respectively located on two sides of the compartment R11, so that the main isolation structure MI2 has a shape with one half narrow and the other half wide. Also, the compartment R11 may accommodate one light emitting element LB and one spare region RA1, and the compartments R12 and R13 may respectively accommodate one light emitting element LB and one light emitting element LG without any spare region RA. In addition, a spare region RA2 may be located outside the main isolation structure MI2, that is, the spare region RA2 is located between the main isolation structures MI2 of the light emitting units LU1 and LU2. In addition, the compartments R12 and R13 of the light emitting unit LU1 and the compartments R12 and R13 of the light emitting unit LU2 may be arranged in a staggered manner to increase the flexible space between the light emitting units LU1 and LU2.

The number of secondary isolation structures SI is not particularly limited and may be determined according to actual configuration requirements of the light emitting units LU1 and LU2. For example, when each of the light emitting units LU1 and LU2 includes more light emitting elements LD, more secondary isolation structures SI may be disposed to separate the main isolation structure MI2 into more compartments to respectively accommodate one or multiple light emitting elements LD and/or spare regions RA1. In addition, the material of the secondary isolation structure SI may be the same as or different from the main isolation structure MI2.

In the embodiment, the display device 10E may further include a color conversion layer CT, and the color conversion layer CT is located in the compartment R11 and covers the light emitting element LB. The color conversion layer CT may include phosphor or a wavelength conversion material with similar properties to convert blue light emitted by the light emitting element LB into, for example, red light, so that the display device 10E can implement full-color display.

In some embodiments, the display device 10E may further include cover layers P3 and P4, wherein the cover layer P3 may be located in the compartments R12 and R13 and cover the light emitting elements LB and LG, and the cover layer P4 may be located between the main isolation structures MI2. An elongation percentage of the cover layer P4 is preferably greater than an elongation percentage of the cover layer P3, and a refractive index difference between the cover layer P3 and the cover layer P4 may be less than 0.2 to ensure that the light emitting element disposed in the spare region RA2 and the light emitting elements disposed in the main isolation structure MI2 have similar optical efficiency.

Figure 7:
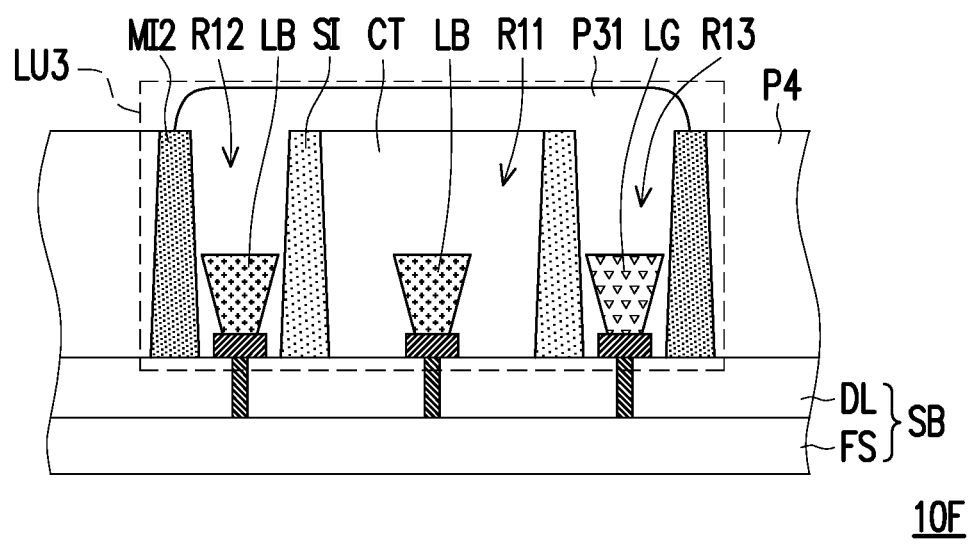
FIG. 7 is a schematic cross-sectional view of a light emitting unit LU3 of a display device 10F according to an embodiment of the disclosure.

FIG. 7 is a schematic cross-sectional view of a light emitting unit LU3 of a display device 10F according to an embodiment of the disclosure. Compared with the light emitting unit LU1 of the display device 10E shown in FIG. 6B, the light emitting unit LU3 of the display device 10F shown in FIG. 7 is different in that a cover layer P31 of the light emitting unit LU3 is located in the compartments R12 and R13, and cover the light emitting element LB in the compartment R12, the light emitting element LG in the compartment R13, and the color conversion layer CT in the compartment R11. In this way, the cover layer P31 can reduce a refractive index difference between the color conversion layer CT and the air, and help to improve the light emitting efficiency and adjust the light field type.

Figure 8:
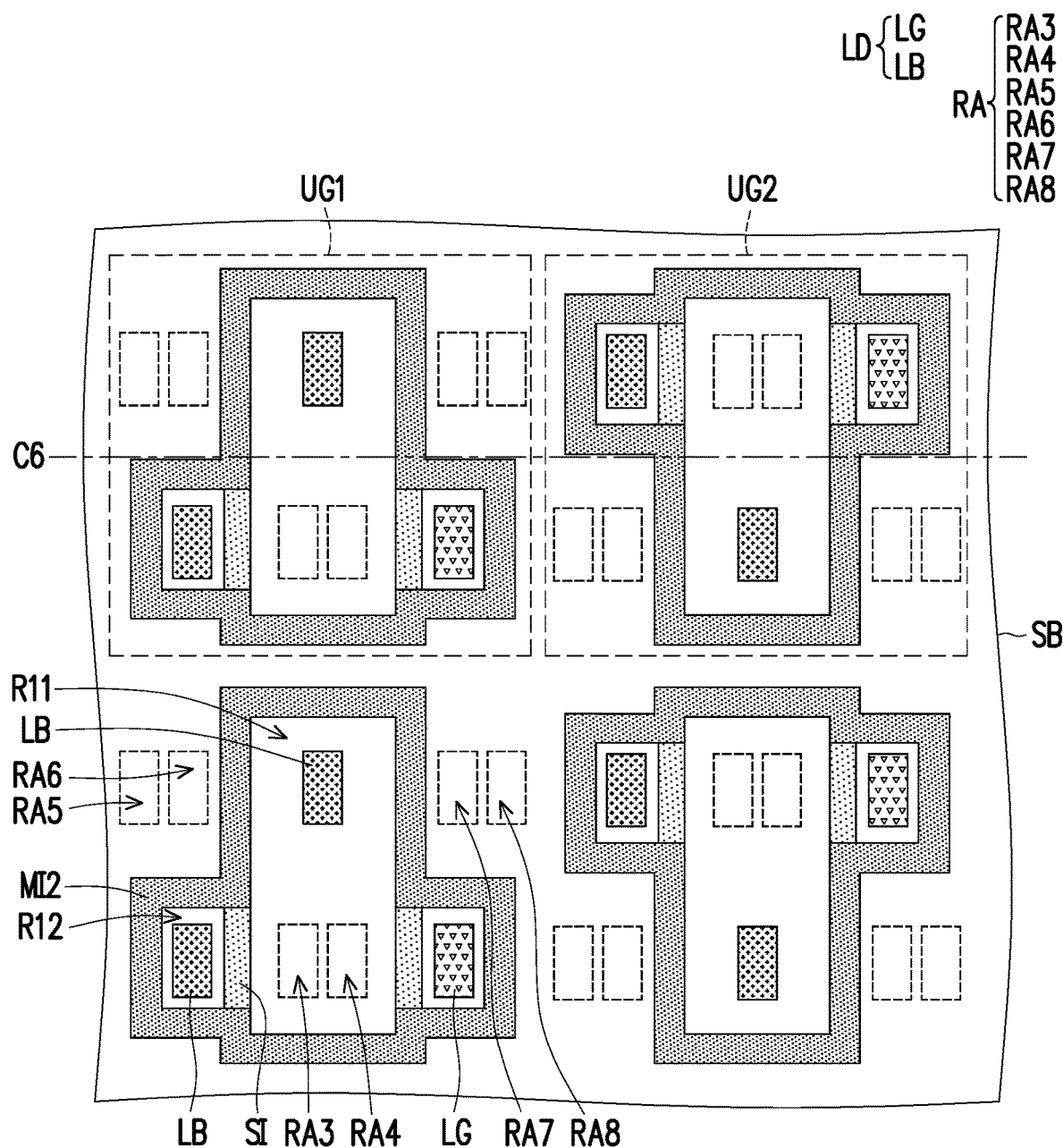
FIG. 8 is a schematic partial top view of a display device 10G according to an embodiment of the disclosure.

FIG. 8 is a schematic partial top view of a display device 10G according to an embodiment of the disclosure. Compared with the display device 10E shown in FIG. 6A to FIG. 6B, the display device 10G shown in FIG. 8 is different in that the display device 10G includes light emitting units UG1 and UG2, wherein the configuration positions of the light emitting elements LB in the compartments R11 of the light emitting units UG1 and UG2 are different from the light emitting units LU1 and LU2, and the number of spare regions RA of the light emitting units UG1 and UG2 is greater than the number of light emitting elements LD.

In the embodiment, the light emitting elements LB in the compartments R11 of the light emitting units UG1 and UG2 and the light emitting elements LB in the compartments R11 of the light emitting units LU1 and LU2 are configured in mirror symmetry with a center line C6. Thereby, the main isolation structure MI2 can adjust the light emitting field type and the viewing angle of the light emitting elements LB in the compartments R11 of the light emitting units UG1 and UG2 after being converted by the color conversion layers CT, while effectively compensating the light field type difference of the compartments R11 of the light emitting units UG1 and UG2.

In the embodiment, when the space is sufficient, the light emitting units UG1 and UG2 may respectively have two spare regions RA3 and RA4 located in the compartment R11 and four spare regions RA5, RA6, RA7, and RA8 located outside the main isolation structure MI2 to facilitate the transfer and the repair of the light emitting elements LD.

Figure 9:
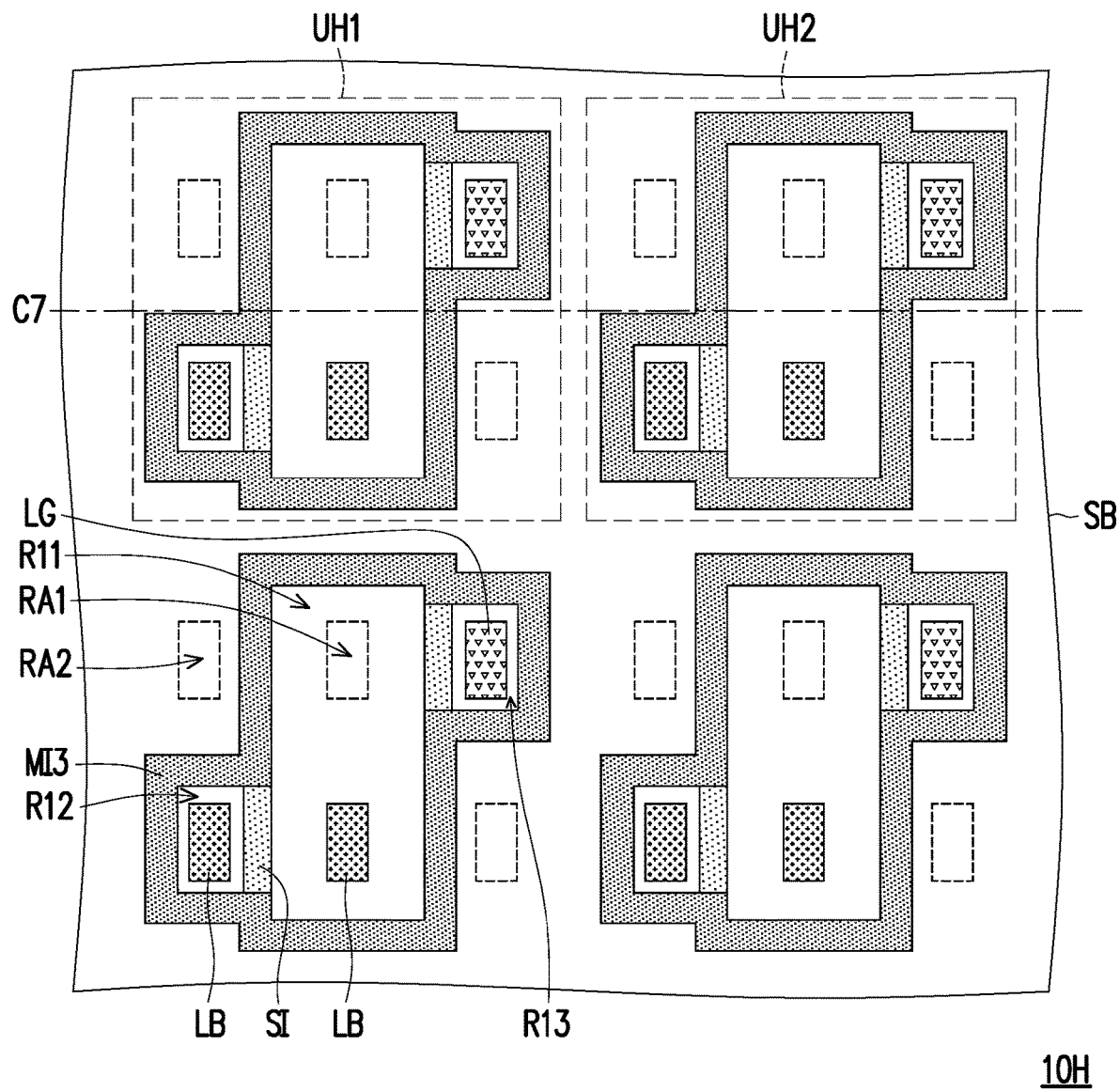
FIG. 9 is a schematic partial top view of a display device 10H according to an embodiment of the disclosure.

FIG. 9 is a schematic partial top view of a display device 10H according to an embodiment of the disclosure. Compared with the display device 10E shown in FIG. 6A and FIG. 6B, the display device 10H shown in FIG. 9 is different in that the display device 10H includes light emitting units UH1 and UH2, and the shapes of main isolation structures MI3 of the light emitting units UH1 and UH2 are different from the shapes of the main isolation structures MI2 of the light emitting units LU1 and LU2, and the configuration positions of the secondary isolation structures SI of the light emitting units UH1 and UH2 are different from the light emitting units LU1 and LU2.

In the embodiment, the compartments R12 and R13 of the light emitting units UH1 and UH2 are arranged in a staggered manner to increase the flexible space between the light emitting units UH1 and UH2. Since the shapes of the main isolation structure MI3 and the main isolation structure MI2 are different, and the configuration positions of the secondary isolation structures SI are different, the light emitting element LG of the light emitting unit UH1 and the light emitting element LB of the light emitting unit UH2 are respectively configured in mirror symmetry with the light emitting element LG of the light emitting unit LU1 and the light emitting element LB of the light emitting unit LU2 with a center line C7. In this way, the light emitting field type of the light emitting elements LB and LG in the compartments R12 and R13 and the light emitting element LB in the compartment R11 can be adjusted, while compensating the monochromatic light field type difference caused by the main isolation structure MI3 to the light emitting elements LB and LG in the compartments R12 and R13 and the light emitting element LB in the compartment R11 individually.

Figure 10:
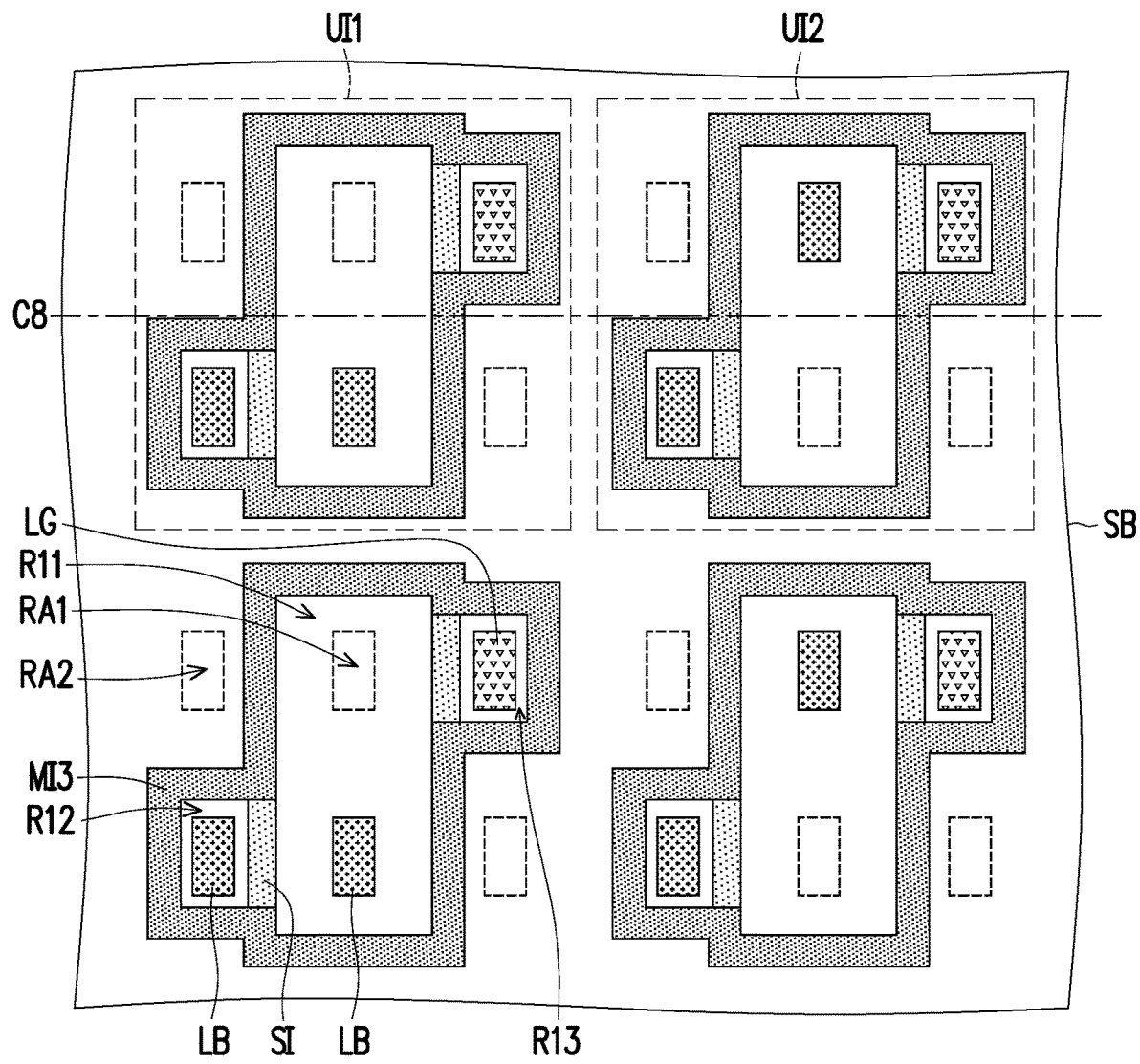
FIG. 10 is a schematic partial top view of a display device 10I according to an embodiment of the disclosure.

FIG. 10 is a schematic partial top view of a display device 10I according to an embodiment of the disclosure. Compared with the display device 10H shown in FIG. 9, the display device 10I shown in FIG. 10 is different in that the display device 10I includes light emitting units UI1 and UI2, wherein the configurations of the light emitting elements LG and LB of the light emitting unit UI1 are the same as the light emitting unit UH1, and the configurations of the light emitting elements LG and LB of the light emitting unit UI2 are different from the light emitting unit UH2.

In the embodiment, the light emitting element LB in the compartment R11 of the light emitting unit UI2 and the light emitting element LB in the compartment R11 of the light emitting unit UH2 are configured in mirror symmetry with a center line C8, so that the light emitting field type of the light emitting element LB in the compartment R11 can be finely adjusted, and the monochromatic light field type difference caused by the main isolation structure MI3 to the light emitting element LB in the compartment R11 can be compensated.

Figure 11A:
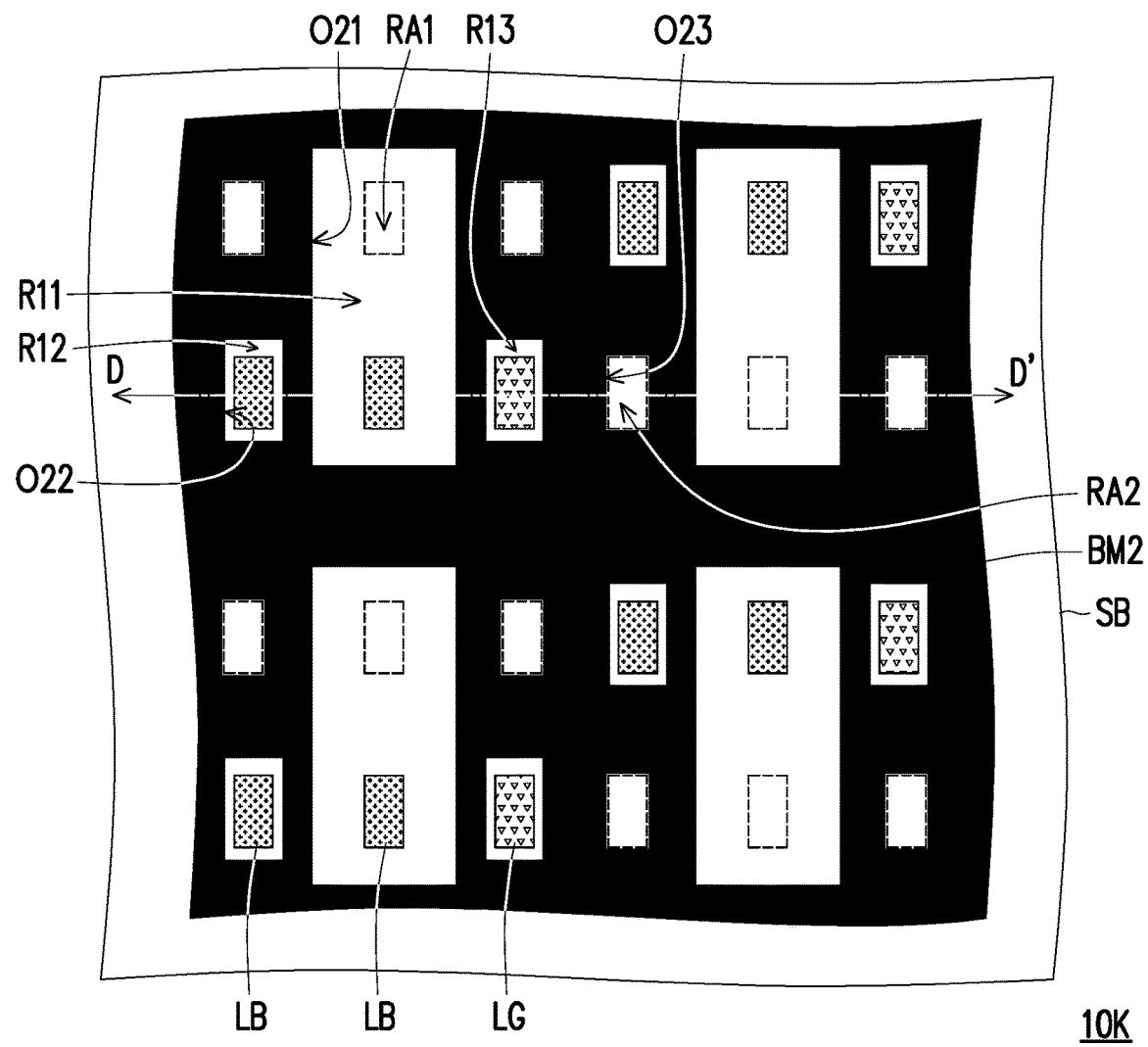
FIG. 11A is a schematic partial top view of a display device 10K according to an embodiment of the disclosure.
Figure 11B:
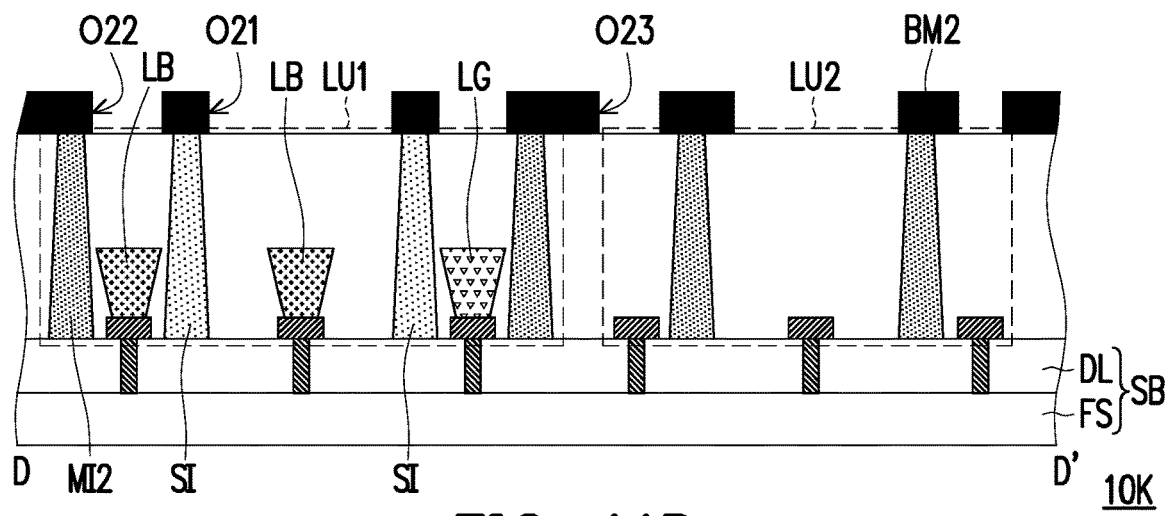
FIG. 11B is a schematic cross-sectional view taken along a section line D-D' of FIG. 11A.

FIG. 11A is a schematic partial top view of a display device 10K according to an embodiment of the disclosure. FIG. 11B is a schematic cross-sectional view taken along a section line D-D' of FIG. 11A. Compared with the display device 10E shown in FIG. 6A and FIG. 6B, the display device 10K shown in FIG. 11A and FIG. 11B is different in that the display device 10K further includes a light shielding layer BM2.

In the embodiment, the light shielding layer BM2 is located on the light emitting units LU1 and LU2, and the light shielding layer BM2 may shield the reflection of ambient light above a metal trace and the main isolation structure MI2 to reduce the brightness of a dark state and improve the contrast. In addition, the light shielding layer BM2 may have multiple openings O21, O22, and O23, wherein the opening O21 may overlap with the light emitting element LB and the spare region RA1 in the compartment R11, the opening O22 may overlap with the light emitting element LB in the compartment R12, and the opening O23 may overlap with the spare region RA2 between the main isolation structures MI2 of the light emitting units LU1 and LU2 to avoid affecting the light emission of the light emitting units LU1 and LU2, while improving the stress adjustment ability of the display device 10K when being bent.

In summary, in the display device of the disclosure, the light emitting elements are surrounded by the main isolation structure of the light emitting unit, so that the light emitting unit has a complete island structure, and the island structures of the light emitting units are mutually independent. In this way, when the display device is bent, the bending mainly occurs in the circuit substrate between the light emitting units, while the light emitting unit can still maintain a complete structure, so that the display device has good flexibility.

Although the disclosure has been disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A display device, comprising:
a circuit substrate;
light emitting units, located on the circuit substrate and electrically connected to pads of the circuit substrate respectively,
wherein each of the light emitting units comprises a main isolation structure and light emitting elements, the main isolation structure surrounds the light emitting elements, and an orthographic projection of the main isolation structure on the circuit substrate is outside an orthographic projection of the pads on the circuit substrate; and
a light shielding layer located on the light emitting units and having first openings, wherein an orthographic projection of the first openings on the circuit substrate overlaps with an orthographic projection of the light emitting elements on the circuit substrate,
wherein the light shielding layer further has second openings, and an orthographic projection of the second openings on the circuit substrate is located outside an orthographic projection of the light emitting units on the circuit substrate.

2. The display device according to claim 1, wherein the circuit substrate comprises a flexible substrate and a driving circuit layer, the driving circuit layer is located between the flexible substrate and the light emitting units, and the pads are located on the driving circuit layer.

3. The display device according to claim 1, wherein the main isolation structures of the light emitting units are separated from each other.

4. The display device according to claim 1, wherein each of the light emitting units further has spare regions, and a number of the spare regions of each of the light emitting units is greater than or equal to a number of the light emitting elements of each of the light emitting units.

5. The display device according to claim 4, wherein the spare regions are all located in the main isolation structure.

6. The display device according to claim 5, wherein a shortest pitch between the main isolation structures is greater than a shortest distance between the main isolation structures and the light emitting elements.

7. The display device according to claim 4, wherein a portion of the spare regions are inside the main isolation structure of each of the light emitting units, and another portion of the spare regions are outside the main isolation structure of each of the light emitting units.

8. The display device according to claim 1, wherein the light emitting elements of each of the light emitting units have different light colors, and light colors of the light emitting elements of the adjacent light emitting units are symmetrically configured.

9. A display device, comprising:
a circuit substrate; and
light emitting units, located on the circuit substrate and electrically connected to the circuit substrate,
wherein each of the light emitting units comprises a main isolation structure and light emitting elements, and the main isolation structure surrounds the light emitting elements,
wherein each of the light emitting units constitutes a pixel of the display device and comprises secondary isolation structures, and each of the secondary isolation structures is disposed between any two of the light emitting elements,
wherein each of the light emitting units further has spare regions, the secondary isolation structures separate each of the main isolation structures into compartments, a first compartment among the compartments accommodates one of the light emitting elements and a first spare region among the spare regions, and
wherein a second compartment among the compartments accommodates another of the light emitting elements and does not accommodate any spare region.

10. The display device according to claim 9, wherein a second spare region among the spare regions is located outside the main isolation structures.

11. The display device according to claim 9, further comprising a color conversion layer located in the first compartment and covering the one of the light emitting elements.

12. The display device according to claim 9, wherein the main isolation structures of the light emitting units are separated from each other.

13. The display device according to claim 9, wherein a number of the spare regions of each of the light emitting units is greater than or equal to a number of the light emitting elements of each of the light emitting units.

14. A display device, comprising:
a circuit substrate;
light emitting units, located on the circuit substrate and electrically connected to the circuit substrate, wherein each of the light emitting units comprises a main isolation structure and light emitting elements, and the main isolation structure surrounds the light emitting elements;
a first cover layer located between the main isolation structures of the light emitting units; and
a second cover layer located in each main isolation structure and covering the light emitting elements,
wherein an elongation percentage of the first cover layer is greater than an elongation percentage of the second cover layer.

15. The display device according to claim 14, wherein the main isolation structures of the light emitting units are separated from each other.

16. The display device according to claim 14, further comprising a color conversion layer located between the second cover layer and one of the light emitting elements.

* * * * *